(12) United States Patent
Nomiya et al.

(10) Patent No.: US 7,595,997 B2
(45) Date of Patent: *Sep. 29, 2009

(54) MULTILAYER CERAMIC ELECTRONIC COMPONENT, MULTILAYER CERAMIC SUBSTRATE, AND METHOD FOR MANUFACTURING MULTILAYER CERAMIC ELECTRONIC COMPONENT

(75) Inventors: Masato Nomiya, Moriyama (JP); Norio Sakai, Moriyama (JP); Mitsuyoshi Nishide, Yasu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/165,700

(22) Filed: Jul. 1, 2008

(65) Prior Publication Data
US 2008/0261005 A1    Oct. 23, 2008

Related U.S. Application Data

(63) Continuation of application No. PCT/JP2006/325805, filed on Dec. 25, 2006.

(30) Foreign Application Priority Data

Feb. 14, 2006   (JP) .............................. 2006-037105
Apr. 26, 2006   (JP) .............................. 2006-122595

(51) Int. Cl.
*H05K 1/14*   (2006.01)
*H01L 23/48*   (2006.01)

(52) U.S. Cl. ................ 361/742; 361/736; 361/743; 361/746; 361/760; 361/770; 257/700; 257/701; 257/778; 257/779

(58) Field of Classification Search ................ 428/210; 361/760–795, 736, 742, 743, 746; 257/700–779
See application file for complete search history.

(56) References Cited

U.S. PATENT DOCUMENTS

| 4,933,030 | A | * | 6/1990 | Dietz | ................ 106/1.14 |
| 5,076,876 | A | * | 12/1991 | Dietz | ................ 156/325 |
| 6,207,550 | B1 | * | 3/2001 | Hase et al. | ................ 438/613 |
| 6,324,067 | B1 | * | 11/2001 | Nishiyama | ................ 361/761 |
| 6,337,123 | B1 | * | 1/2002 | Ryugo et al. | ................ 428/210 |

(Continued)

FOREIGN PATENT DOCUMENTS

JP   04-099834 U   8/1992
JP   2004-055728 A   2/2004

OTHER PUBLICATIONS

Official communication issued in the International Application No. PCT/JP2006/325805, mailed on Mar. 20, 2007.

*Primary Examiner*—Cathy Lam
(74) *Attorney, Agent, or Firm*—Keating & Bennett, LLP

(57) ABSTRACT

In a multilayer ceramic electronic component, a pedestal portion is provided on a region of a first main surface of a multilayer ceramic body and includes a non-metallic inorganic powder and a resin so that the pedestal portion is fixed to the first main surface with at least the resin, the multilayer ceramic body being formed by stacking a ceramic base material layer and a shrinkage-inhibiting layer having a predetermined conductor pattern. Also, a via hole conductor is disposed in the pedestal portion so that one of the end surfaces is exposed in a surface of the pedestal portion, and a surface mounting-type electronic component such as a semiconductor element is connected, through a conductive binder, to the one of the end surfaces of the via hole conductor exposed in the surface of the pedestal portion. A resin is provided between the surface mounting-type electronic component and the pedestal portion, the resin having the same composition as in the resin of the pedestal portion. A semiconductor element is mounted as the surface mounting-type electronic component on the pedestal portion.

11 Claims, 8 Drawing Sheets

U.S. PATENT DOCUMENTS

| | | | |
|---|---|---|---|
| 6,468,640 B2 * | 10/2002 | Nishide et al. | 428/210 |
| 6,815,046 B2 * | 11/2004 | Mandai et al. | 428/210 |
| 6,891,109 B2 * | 5/2005 | Nishide et al. | 174/258 |
| 7,033,864 B2 * | 4/2006 | Libres et al. | 438/118 |
| 7,226,654 B2 * | 6/2007 | Kawai et al. | 428/210 |
| 2005/0023032 A1 | 2/2005 | Kawai et al. | |

* cited by examiner

MULTILAYER CERAMIC ELECTRONIC COMPONENT, MULTILAYER CERAMIC SUBSTRATE, AND METHOD FOR MANUFACTURING MULTILAYER CERAMIC ELECTRONIC COMPONENT

BACKGROUND OF THE INVENTION

1. Field of the Invention

The present invention relates to a multilayer ceramic electronic component, a multilayer ceramic substrate, and a method for manufacturing a multilayer ceramic electronic component.

2. Description of the Related Art

In recent years, the performance of electronic components in the electronics field has been significantly improved, thereby contributing to speeding up of information processing, miniaturization, and diversification of function of information processing apparatuses such as a large scale computer, a mobile communication terminal, a personal computer, and other apparatuses.

One such electronic component is a multichip module (MCM) in which a plurality of semiconductor devices, such as VLSI and ULSI, is mounted on a ceramic substrate. Such a module includes a ceramic multilayer substrate in which wiring conductors are three-dimensionally arranged to increase the mounting density of LSIs and securely electrically connecting LSIs.

The ceramic multilayer substrate is formed by stacking a plurality of ceramic layers and is provided with wiring conductors for forming circuits on a surface of the substrate and inside the substrate. Mobile communication terminals, such as a cellular phone and an automobile radio communication device, must have highly functional, high-density mounting, and further miniaturization is required. In addition, depending on the application, products using the multilayer ceramic substrate must be resistant to impact.

On the other hand, as a method for mounting a semiconductor device on a substrate, a mounting method has been proposed in which as shown in FIG. 11, solder balls 54 provided on a semiconductor element 53 are melt-bonded to a conductor pattern (bump) 52 provided on a substrate 51 using via electrodes or printed electrodes, and a thermosetting resin 55 is provided to form an impact-relaxing layer between the substrate 51 and the semiconductor element 53 in order to improve impact resistance (see, for example, Japanese Unexamined Utility Model Registration Application Publication No. 4-99834).

Such a mounting method or mounting structure is effective to improve impact resistance of a product using a ceramic multilayer substrate. However, when such a mounting structure is used, in order to miniaturize a product, it is necessary to further decrease the size of the solder balls 54 and the gap between the solder balls.

However, when the diameter of the solder balls is decreased, the electrode bonding area (bump area) for securing conductivity is decreased, and the thickness of the thermosetting resin (impact-relaxing layer) 55 provided between the substrate 51 and the semiconductor element 53 is decreased, such that the impact resistance is insufficient even using a ceramic multilayer substrate having such a mounting structure as disclosed in Japanese Unexamined Utility Model Registration Application Publication No. 4-99834).

In addition, a conventional mounting structure (semiconductor device) is shown in FIG. 12 in which electrodes 62 provided on the rear surface of a semiconductor element 61 are mounted on a multilayer wiring substrate 64 having a plurality of projecting electrodes 63 which are provided on a surface thereof and which have conductive adhesive ends leveled to the same plane, the electrodes 62 of the semiconductor element 61 and the ends of the projecting electrodes 63 are electrically bonded, and a shrinkable insulating resin layer 65 is filled between the semiconductor element 61 and the multilayer wiring board 64 (see, for example, Japanese Unexamined Patent Application Publication No. 11-26631).

In a semiconductor device including the semiconductor element 61 mounted on the multilayer wiring substrate 64, the mounting structure of Japanese Unexamined Patent Application Publication No. 11-26631 permits mounting of the semiconductor element 61 with high reliability and no requirement for the multilayer wiring substrate 64 to be extremely flat.

However, in the conventional mounting structure, limits actually occur on a reduction in diameter of the projecting electrodes (columnar electrodes) 63, improvement in the aspect ratio, i.e., the ratio (height/diameter) of the height to the diameter of the projecting electrodes (columnar electrodes) 63, and a reduction in the gap between the adjacent projecting electrodes (columnar electrodes) 63, thereby failing to sufficiently comply with the requirement for the projecting electrodes (columnar electrodes) 63 to have a smaller diameter and a higher aspect ratio.

SUMMARY OF THE INVENTION

To overcome the problems described above, preferred embodiments of the present invention provide a multilayer ceramic electronic component having outstanding impact resistance, a reduced size, and high dimensional precision and reliability, a multilayer ceramic substrate, and a method for manufacturing a multilayer ceramic electronic component.

A multilayer ceramic electronic component according to a preferred embodiment of the present invention includes a multilayer ceramic body which is formed by stacking a ceramic base material layer and a shrinkage-inhibiting layer arranged to suppress shrinkage in the planar direction of the ceramic base material layer and which has a predetermined conductor pattern; a pedestal portion provided on a region of a first main surface of the multilayer ceramic body and including a non-metallic inorganic powder and a resin so that the pedestal portion is fixed to the first main surface with at least the resin; a via hole conductor provided in the pedestal portion so that one of the end surfaces is exposed in a surface of the pedestal portion; and a surface mounting-type electronic component connected, through a conductive binder, to the one of the end surfaces of the via hole conductor exposed in the surface of the pedestal portion.

Preferably, a resin is provided between the surface mounting-type electronic component and the pedestal portion, the resin having the same composition as the resin of the pedestal portion.

Preferably, the surface mounting-type electronic component which is connected, through the conductive binder, to the one of the end surfaces of the via hole conductor exposed in the surface of the pedestal portion is a semiconductor element.

Preferably, a surface mounting-type electronic component is also mounted on a region of the first main surface of the multilayer ceramic body, in which the pedestal portion is not provided.

Preferably, the via hole conductor is arranged to pass through the pedestal portion, and the other end surface not exposed in the surface of the pedestal portion is connected to the conductor pattern of the multilayer ceramic body.

Preferably, the shrinkage-inhibiting layer is disposed on the first main surface of the multilayer ceramic body.

Preferably, the area of the pedestal portion is less than that of the surface mounting-type electronic component mounted on the pedestal portion.

Preferably, the thickness of the pedestal portion is about 30 µm to about 150 µm, for example.

Preferably, the ceramic base material layer is made of a low-temperature sintered ceramic as a main component, and the shrinkage-inhibiting layer is composed of a sintering-resistant ceramic as a main component which is not substantially sintered at the sintering temperature of the low-temperature sintered ceramic.

Preferably, the non-metallic inorganic powder of the pedestal portion is a ceramic powder which is not substantially sintered at the sintering temperature of the ceramic defining the ceramic base material layer.

A multilayer ceramic substrate according to another preferred embodiment of the present invention includes a multilayer ceramic body which is formed by stacking a ceramic base material layer and a shrinkage-inhibiting layer arranged to suppress shrinkage in the planar direction of the ceramic base material layer and which has a predetermined conductor pattern; a pedestal portion provided on a region of a first main surface of the multilayer ceramic body and including a non-metallic inorganic powder and a resin so that the pedestal portion is fixed to the first main surface with at least the resin; and a via hole conductor provided in the pedestal portion so that one of the end surfaces is exposed in a surface of the pedestal portion.

A method for manufacturing a multilayer ceramic electronic component according to another preferred embodiment includes a step of preparing a green multilayer ceramic body by stacking a ceramic base material layer and a shrinkage-inhibiting layer arranged to suppress shrinkage in the planar direction of the ceramic base material layer, the ceramic body having a predetermined conductor pattern; a step of providing a pedestal portion on a region of a first main surface of the multilayer ceramic body, the pedestal portion including a non-metallic inorganic powder as a main component and including a via hole conductor one of the end surfaces of which is exposed in a surface of the pedestal portion; a step of firing the green multilayer ceramic body provided with the pedestal portion; a step of mounting, through a conductive binder, a surface mounting-type electronic component on the one of the end surfaces of the via hole conductor exposed in the surface of the pedestal portion; and a step of providing a resin between the pedestal portion and the surface mounting-type electronic component and in the pedestal portion composed of the non-metallic inorganic powder as the main component and curing the resin.

A multilayer ceramic electronic component according to preferred embodiments of the present invention includes a multilayer ceramic body which is formed by stacking a ceramic base material layer and a shrinkage-inhibiting layer arranged to suppress shrinkage in the planar direction of the ceramic base material layer and which has a predetermined conductor pattern, a pedestal portion provided on a region of a first main surface of the multilayer ceramic body and including a non-metallic inorganic powder and a resin so that the pedestal portion is fixed to the first main surface with at least the resin, a via hole conductor provided in the pedestal portion so that one of the end surfaces is exposed in a surface of the pedestal portion, and a surface mounting-type electronic component connected, through a conductive binder, to the one of the end surfaces of the via hole conductor exposed in the surface of the pedestal portion. Therefore, it is possible to provide a multilayer ceramic electronic component having outstanding impact resistance, a reduced size, high dimensional precision, and high reliability.

In other words, the pedestal portion has a structure in which an aggregate of the non-metallic inorganic powder is impregnated with the resin, and thus the pedestal portion is fixed to the first main surface of the multilayer ceramic body with at least the resin and has high mechanical strength and excellent bonding strength to the multilayer ceramic body. In addition, the surface mounting-type electronic component is bonded, for example, through the conductive binder such as solder, to the one of the end surfaces of the via hole conductor (columnar electrode) which is disposed so that the one of the end surfaces is exposed in the surface of the pedestal portion. Therefore, the surface mounting-type electronic component is securely bonded to the multilayer ceramic body through the pedestal portion, and thus, excellent impact resistance can be obtained as compared to a conventional case in which a surface mounting-type electronic component is electrically directly bonded to a thin plate-like electrode of a substrate. Therefore, even when an impact is applied to the multilayer ceramic body, the pedestal portion suppresses the transmission of the impact to the connecting portion between the surface mounting-type electronic component and the conductive binder. As a result, it is possible to achieve a bonding structure for a surface mounting-type electronic component in which bonding reliability is not degraded.

As an example of the configuration of the pedestal portion which includes the non-metallic inorganic powder and the resin and which is fixed to the multilayer ceramic body through at least the resin, a green ceramic molded product disposed on a first main surface of a multilayer ceramic body is heat-treated to sinter a main portion or form a porous state which is substantially not sintered but maintains a predetermined shape, preparing an aggregate of a ceramic powder, which is a non-metallic inorganic powder, i.e., a porous ceramic molded product, and a resin is impregnated into the porous ceramic molded product and cured to fix a pedestal portion to the first main surface of the multilayer ceramic body through at least the resin. When the ceramic constituting the pedestal portion is sintered together with the ceramic constituting the multilayer ceramic body, the pedestal portion may be fixed to the multilayer ceramic body by not only the adhesive force of the resin but also the fixing strength of the ceramic defining the pedestal portion and the ceramic defining the multilayer ceramic body.

Furthermore, the via hole conductor is disposed or buried in the pedestal portion so that one of the end surfaces is exposed. It is thus possible to decrease the diameter of the via hole conductor, improve the aspect ratio, i.e., the ratio (height/diameter) of the height to diameter, of the via hole conductor, and decrease the distance between the adjacent via hole conductors (columnar electrodes), as compared to when the via hole conductor is entirely exposed. In addition, it is possible to prevent the occurrence of falling of the via hole conductor during mounting of the surface mounting-type electronic component, thereby achieving miniaturization of a product and an improvement in reliability.

In preferred embodiments of the present invention, the surface mounting-type electronic component is bonded, through the conductive binder such as solder, to one of the end surfaces of the via hole conductor exposed in the surface of the pedestal portion. Therefore, the conductive binder such as solder used to bond the surface mounting-type electronic component can be put into contact with the via hole conductor avoiding contact with the multilayer ceramic body. Thus, even when the shrinkage-inhibiting layer is disposed on the surface of the multilayer ceramic body, tensile stress is suppressed or prevented from occurring between the shrinkage-inhibiting layer and the surface mounting-type electronic component during mounting of the surface mounting-type electronic component. As a result, it is possible to prevent breakage in a region at which the surface mounting-type electronic component is mounted near the shrinkage-inhibiting layer, i.e., the interface between the shrinkage-inhibiting layer and the conductor pattern, thereby improving the impact resistance.

In addition, the multilayer ceramic electronic component according to preferred embodiments of the present invention includes the shrinkage-inhibiting layer provided in the body, thereby decreasing distortion of the body. Consequently, a multilayer ceramic electronic component having excellent dimensional precision and high reliability is provided.

In preferred embodiments of the present invention, examples of the surface mounting-type electronic component mounted on the pedestal include a transistor, IC, LSI, and other suitable components. Since the structure of the multilayer ceramic electronic component of preferred embodiments of the present invention is suitable for the mounting structure of a surface mounting-type electronic component having many narrow-gap I/O terminals at a high density in substantially the same plane, the structure is particularly useful, for example, in mounting BGA (Ball Grid Array) connection-type large-scale semiconductor elements, such as IC and LSI, as a bare chip.

When a resin having the same composition as the resin of the pedestal portion is provided between the surface mounting-type electronic component and the pedestal portion, a resin layer having a high affinity for the resin of the pedestal portion can be provided between the surface mounting type electronic component and the pedestal portion. Therefore, a multilayer ceramic electronic component having further improved impact resistance and high reliability is provided.

When the surface mounting-type electronic component which is connected, through the conductive binder, to the one of the end surfaces of the via hole conductor exposed in the surface of the pedestal portion is a semiconductor element, as described above, a BGA (Ball Grid Array) connection-type large-scale semiconductor element having many narrow-gap I/O terminals at a high density in substantially the same plane can be mounted as a bare chip.

When a surface mounting-type electronic component is also mounted on a region of the first main surface of the multilayer ceramic body, in which the pedestal portion is not provided, it is possible to provide a multilayer ceramic electronic component having an increased component mounting density, a reduced size, and greatly improved performance.

The surface mounting-type electronic component may be a passive element having less I/O terminals than the surface mounting type electronic component disposed on the pedestal, such as a chip capacitor, a chip resistor, a chip thermistor, a chip inductor, or other suitable component.

When the via hole conductor is arranged to pass through the pedestal portion, and the other end surface not exposed in the surface of the pedestal portion is connected to the conductor pattern of the multilayer ceramic body, the surface mounting-type electronic component can be electrically connected to the conductor pattern of the multilayer ceramic body through the via hole conductor. It is thus possible to provide a multilayer ceramic electronic component having a simple configuration, improved impact resistance, and a reduced size.

Preferably, the multilayer ceramic electronic component includes the shrinkage-inhibiting layer disposed on the first main surface of the multilayer ceramic body. Therefore, shrinkage in the planar direction of the multilayer ceramic body can be more securely suppressed or prevented in the firing step, and the multilayer ceramic body having improved mechanical strength is obtained. Thus, it is possible to provide a multilayer ceramic electronic component having high dimensional precision and high reliability.

More specifically, when the shrinkage-inhibiting layer is also disposed on the first main surface which is a surface of the multilayer ceramic body, compressive stress occurs in the shrinkage-inhibiting layer due to the ceramic layer, and conversely, tensile stress occurs in the ceramic layer due to no shrinkage from the shrinkage-inhibiting layer. The strength of a ceramic substrate is generally increased when compressive stress acts on a surface thereof. Therefore, from the viewpoint of increasing the strength of the multilayer ceramic body, it is preferred to dispose the shrinkage-inhibiting layer on the first main surface which is a surface of the multilayer ceramic body.

When the area of the pedestal portion is less than that of the surface mounting-type electronic component, such as a semiconductor element, mounted on the pedestal portion, a surface region of the multilayer ceramic body, on which the pedestal portion is not disposed, i.e., a region on which another surface mounting-type electronic component can be mounted, can be extended. Thus, it is possible to provide a multilayer ceramic electronic component provided with an increased number of surface mounting-type electronic components and having a reduced size, an increased density, and outstanding reliability.

When the thickness of the pedestal portion preferably is in the range of about 30 µm to about 150 µm, for example, it is possible to provide a multilayer ceramic electronic component having outstanding impact resistance, a reduced size, high dimensional precision, and high reliability.

When the thickness of the pedestal portion is less than about 30 µm, an impact caused by a fall is concentrated in the junction between the pedestal portion and the ceramic body, thereby decreasing the breakage inhibiting effect on the impact and degrading impact resistance. When the thickness of the pedestal portion exceeds about 150 µm, it becomes difficult to sufficiently fill the space between the surface mounting type electronic component, such as a semiconductor device, and the pedestal portion with the resin. Therefore, the thickness of the pedestal portion is preferably in the range of about 30 µm to about 150 µm, for example.

When the ceramic base material layer includes a low-temperature sintered ceramic as a main component, and the shrinkage-inhibiting layer includes a sintering-resistant ceramic as a main component which is not substantially sintered at the sintering temperature of the low-temperature sintered ceramic, sintering can be effectively performed at a relatively low temperature without causing shrinkage in the planar direction. Thus, it is possible to provide a multilayer ceramic electronic component having outstanding characteristics while decreasing the manufacturing cost.

When a ceramic powder which is not substantially sintered at the sintering temperature of the ceramic defining the ceramic base material layer is used as the non-metallic inorganic powder of the pedestal portion, the pedestal portion and the multilayer ceramic body can be simultaneously fired, thereby suppressing distortion and shifting of a mounting region due to a difference in firing shrinkage behavior. Furthermore, since the green ceramic powder aggregate includes voids do not cause breakage of the green layer, the resin can be easily impregnated into the voids.

The multilayer ceramic substrate according to a preferred embodiment of the present invention includes the multilayer ceramic body which is formed by stacking the ceramic base material layer and the shrinkage-inhibiting layer arranged to suppress shrinkage in the planar direction of the ceramic base material layer and which has the predetermined conductor pattern, the pedestal portion provided on a region of the first main surface of the multilayer ceramic body and including the non-metallic inorganic powder and the resin so that the pedestal portion is fixed to the first main surface with at least the resin, and the via hole conductor provided in the pedestal portion so that one of the end surfaces is exposed in the surface of the pedestal portion. Therefore, for example, when a surface mounting-type electronic component, such as a semiconductor element, is bonded using a conductive binder to one of the end surfaces of the via hole conductor exposed in the surface of the pedestal portion in the process of manufacturing a final product, a multilayer ceramic electronic component having desired characteristics can be efficiently manufactured.

When the multilayer ceramic substrate according to this preferred embodiment of the present invention is used, it is possible to provide a multilayer ceramic electronic component provided with a surface mounting-type electronic component, which is bonded through a conductive binder to one of the end surfaces of the via hole conductor exposed in the surface of the pedestal portion, and having outstanding impact resistance, a reduced size, high dimensional precision, and high reliability.

The method for manufacturing a multilayer ceramic electronic component according to a preferred embodiment of the present invention includes preparing a green multilayer ceramic body by stacking a green ceramic base material layer and a shrinkage-inhibiting layer arranged to suppress shrinkage in the planar direction of the ceramic base material layer, the ceramic body having a predetermined conductor pattern; providing a pedestal portion on a region of a first main surface of the multilayer ceramic body, the pedestal portion including a non-metallic inorganic powder as a main component and including a via hole conductor on one of the end surfaces of which is exposed in the surface of the pedestal portion; firing the green multilayer ceramic body provided with the pedestal portion; mounting, using a conductive binder, a surface mounting-type electronic component on the one of the end surfaces of the via hole conductor exposed in the surface of the pedestal portion; and providing a resin between the pedestal portion and the surface mounting-type electronic component and in the pedestal portion made of the non-metallic inorganic powder and curing the resin. Therefore, it is possible to efficiently manufacture a multilayer ceramic electronic component provided with a resin as an impact resistant layer provided between a surface mounting-type electronic component, such as a semiconductor element, and the pedestal portion and having outstanding impact resistance, a reduced size, high dimensional precision, and high reliability.

Other features, elements, characteristics, and advantages of the present invention will become more apparent from the following detailed description of preferred embodiments of the present invention with reference to the attached drawings.

DETAILED DESCRIPTION OF PREFERRED EMBODIMENTS

Figure 1:
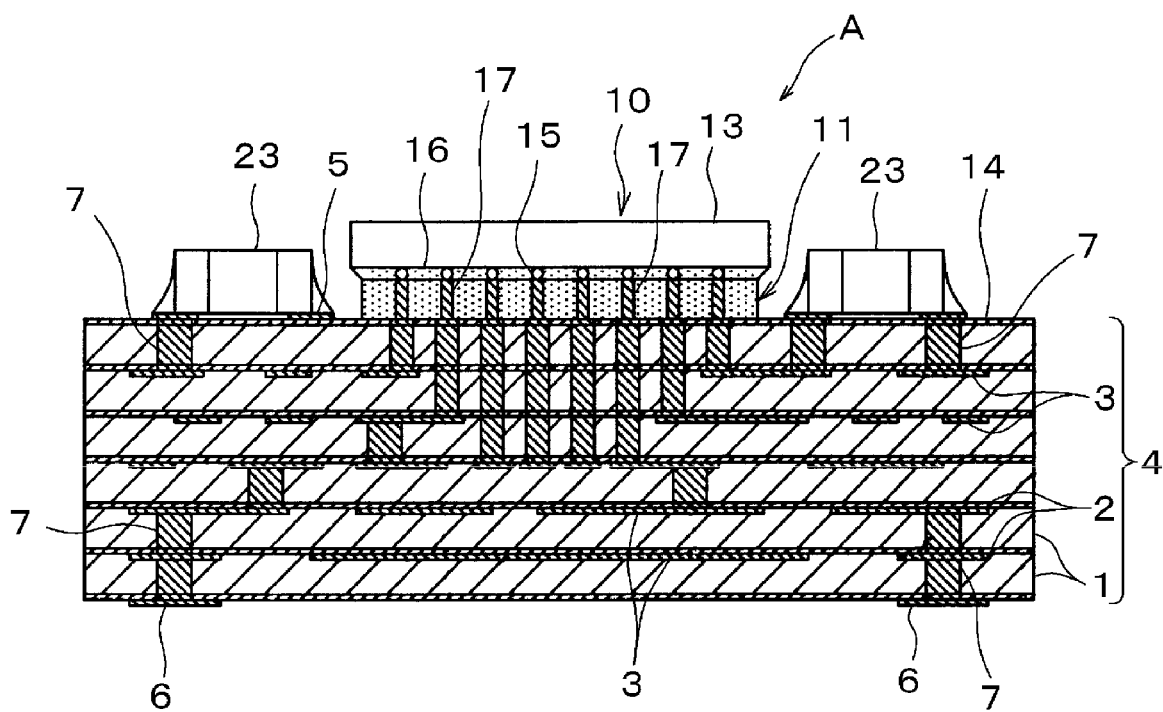
FIG. 1 shows a configuration of a multilayer ceramic electronic component (multilayer ceramic substrate) according to a preferred embodiment of the present invention.

In preferred embodiments of the present invention, a low-temperature sintered ceramic raw material powder is preferably used as a first ceramic material defining a ceramic base material layer. The low-temperature sintered ceramic raw material powder can be co-fired with Ag and Cu having low resistance, and thus, a multilayer ceramic electronic component having outstanding high-frequency characteristics can be obtained.

In addition, a material including, as a main component, any one of various sintering-resistant ceramics, such as alumina, zirconia, and silica, which are not substantially sintered at the sintering temperature of the ceramic defining the ceramic base material layer can be used as a second ceramic material defining a shrinkage-inhibiting layer (i.e., a second ceramic layer). When the second ceramic layer includes the green second ceramic material having a higher sintering temperature than that of the first ceramic material, the second ceramic layer provides the function of suppressing shrinkage in a plane direction of the first ceramic layer in a firing step.

Furthermore, in preferred embodiments of the present invention, the second ceramic material defining the shrinkage-inhibiting layer (i.e., the second ceramic layer) can be used as a non-metallic inorganic powder material which defines a pedestal portion.

In addition, any one of various ceramic green sheets having different compositions from that of the ceramic material defining the second ceramic layer can be used as the non-metallic inorganic powder material which defines the pedestal portion.

Further, as the non-metallic inorganic powder material defining the pedestal portion, a non-metallic inorganic component, such as glass, may be included in a ceramic material which is not sintered during sintering of the first ceramic layer.

For example, when the content of a glass material is about 0.3 parts to about 50 parts by weight relative to 100 parts by weight of the ceramic material, for example, the ceramic powder is fixed by the glass during firing, and the strength of the pedestal portion can be significantly improved.

When the content of the glass material is less than about 0.3 parts by weight, the pedestal portion has insufficient strength, and thus, has low handleability. When the content of the glass material exceeds about 50 parts by weight, voids are sufficiently produced in the pedestal portion during firing, and thus resin impregnation may be inhibited. The content of the glass material is more preferably in the range of about 1 part to about 15 parts by weight, for example, depending on the type and composition of the glass material used.

In addition to or instead of the glass material, an additive which can produce a liquid phase by firing, such as an alkali metal oxide, an alkaline-earth metal oxide, or boron oxide, may be added in the range of about 0.1 parts to about 10 parts by weight, for example.

Furthermore, a pedestal via hole conductor which is disposed in the pedestal portion preferably has a diameter in the range of about 50 μm to about 120 μm, for example. Since the height of the pedestal via hole conductor is determined by the thickness of the pedestal portion, the height is usually in the range of about 30 μm to about 150 μm, for example, according to the thickness of the pedestal portion. When the thickness of the pedestal portion is in the range of about 30 μm to about 150 μm, a multilayer ceramic electronic component having outstanding impact resistance, a reduced size, high dimensional precision, and high reliability is obtained.

Also, in preferred embodiments of the present invention, at least one of a via hole conductor and a conductor pattern may be provided on the ceramic base material layer or the shrinkage-inhibiting layer. When the ceramic base material layer includes a low-temperature sintered ceramic raw material powder as a main component, a main constituent material of the via hole conductor and the conductor pattern can be selected from metals or alloys each including, as a main component, at least one selected from the group consisting of Ag, Au, and Cu which have excellent high frequency characteristics. The alloys may include Pd, W, Ni, or other suitable material.

The material selected from the metals or alloys each including, as a main component, at least one selected from the group consisting of Ag, Au, and Cu can be used as a preferred constituent material of the pedestal via hole conductors disposed in the pedestal portion.

In the multilayer ceramic electronic component according to preferred embodiments of the present invention, the second ceramic material defining the shrinkage-inhibiting layer is fixed by a portion (e.g., a glass component) of the first ceramic material which penetrates from the first ceramic layer by softening and flowing, thereby solidifying the second ceramic layer and bonding the first and second ceramic layers.

Therefore, the first ceramic material preferably includes a softening fluid component which penetrates into the second ceramic layer by softening and flowing. Since the sintering temperature of the low-temperature sintered ceramic raw material powder is about 800° C. to about 1000° C., an amorphous glass powder having a softening temperature of about 700° C. to about 800° C., a crystallized glass powder which is increased in viscosity by crystallization at about 800° C. or more after densification of a constrained layer, or an oxide powder which can produce a liquid phase before the completion of sintering at about 800° C. to about 1000° C. can be used as the softening fluid component to be included in the first ceramic material.

In particular, a preferred softening fluid powder is a glass powder including at least one inorganic oxide of $SiO_2$, $B_2O_3$, $GeO_2$, $ZrO_2$, $Al_2O_3$, $P_2O_3$, and $V_2O_3$, for example. These oxides function as a network forming oxide for the glass component.

The low-temperature sintered raw material powder used as the first ceramic material is preferably a non-glass low-temperature sintered ceramic raw material powder. More specifically, according to preferred embodiments of the present invention, when a ceramic material having a composition which produces a liquid phase component (glass component) during firing, such as a non-glass low-temperature sintered ceramic, is selected, the shrinkage-inhibiting layer can be sufficiently densified even when the raw material powder does not include the glass powder.

Also, according to preferred embodiments of the present invention, the thickness of the first ceramic layer defining the ceramic base material layer is preferably in the range of about 10 μm to about 100 μm after firing, for example. When the thickness falls in this range, shrinkage in the firing step can be preferably effectively suppressed by the shrinkage-inhibiting layer (i.e., the second ceramic layer) in the firing step.

In addition, the thickness of the shrinkage-inhibiting layer is preferably in the range of about 0.5 μm to about 50 μm, for example. When the thickness falls in this range, a restraining force can be sufficiently imposed on the ceramic base material layer. The thickness of the shrinkage-inhibiting layer is more preferably in the range of about 1 μm to about 10 μm, for example.

The characteristics of the present invention will be described in further detail below with reference to preferred embodiments of the present invention.

First Preferred Embodiment

Figure 2A:
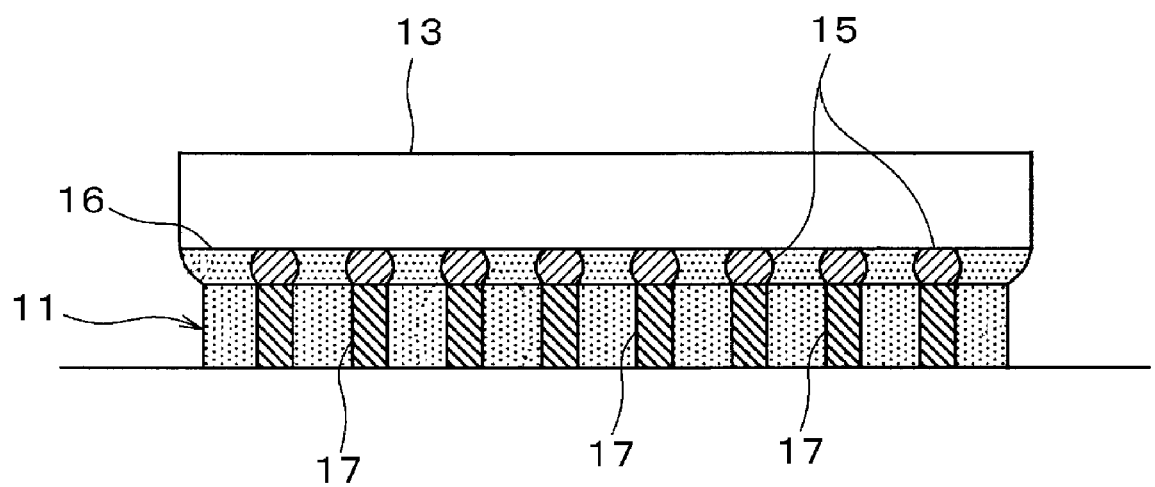
FIG. 2A shows a principal configuration of the multilayer ceramic electronic component shown in FIG. 1.
Figure 2B:
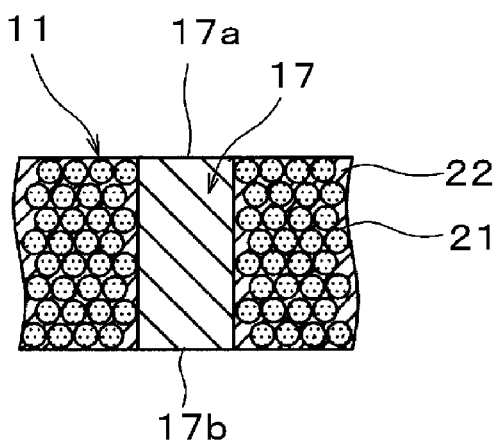
FIG. 2B is an enlarged view of the principal portion shown in FIG. 2A.

FIG. 1 is a sectional view showing the entire structure of a multilayer ceramic substrate of a multilayer ceramic electronic component according to a first preferred embodiment of the present invention. FIG. 2A is an enlarged partial view showing a region in which a mounted component is mounted on the multilayer ceramic substrate of the multilayer ceramic electronic component shown in FIG. 1. FIG. 2B is an enlarged schematic sectional view of a portion of a pedestal portion defining a multilayer ceramic electronic component in the preferred embodiment of the present invention.

As shown in FIG. 1, a multilayer ceramic electronic component A (multilayer ceramic substrate 10) includes first ceramic layers 1 defining ceramic base material layers, second ceramic layers 2 defining shrinkage-inhibiting layers stacked in contact with a main surface of each of the first ceramic layers and arranged to suppress shrinkage in the planar direction of the ceramic base material layers in a firing step, and internal in-plane conductors 3 define conductor patterns provided between the first and the second ceramic layers 1 and 2.

In addition, external conductors 5 and terminal electrodes 6 are provided on the surfaces of a multilayer ceramic body 4 provided with the first and second ceramic layers 1 and 2 and the internal in-plane conductors 3, and via hole conductors 7 are arranged to pass through the first ceramic layers 1 and/or the second ceramic layers 2. The internal in-plane conductors 3 disposed on different layers or the internal in-plane conductors 3 and the external conductors 5 or the terminal electrodes 6 are electrically connected to each other through the via hole conductors 7 as required.

The multilayer ceramic electronic component A according to the first preferred embodiment further includes a pedestal portion 11 which is fixed, with a resin 22, to a region of the upper surface (first main surface) 14 of the multilayer ceramic body 4 provided with the first and second ceramic layers 1 and 2 and the internal in-plane conductors 3, the pedestal portion 11 being made of a material including a non-metallic inorganic powder 21 (FIG. 2B) and the resin 22 (FIG. 2B). More specifically, an aggregate of the non-metallic inorganic powder 21 is fixed to the first main surface 14 with the resin 22. The pedestal portion 11 is provided with pedestal via hole conductors 17 which are disposed such that one (upper end surface) 17a of the end surfaces of each via hole conductor 17 is exposed in the upper surface of the pedestal portion 11, and the other end surface 17b is connected to the corresponding internal in-plane conductor 3 through the via hole conductor 7 disposed in the multilayer ceramic body 4.

Further, a semiconductor element 13 is disposed as a surface mounting-type electronic component on the pedestal portion 11. The semiconductor element 13 is electrically connected to the pedestal via hole conductors 17, which are disposed in the pedestal portion 11, through a conductive binder, such as solder 15.

Further, a resin layer 16 is provided by filling a resin having the same composition as the resin used for the pedestal portion 11 in the space between the pedestal portion 11 and the semiconductor element 13.

The first ceramic layers 1 are formed by sintering a first ceramic material and controlling the substrate characteristics of the multilayer ceramic substrate 10. The thickness of the first ceramic layers 1 is preferably in the range of about 10 μm to about 100 μm after firing, for example. Although the thickness of the first ceramic layers 1 is not necessarily limited to the range, the thickness is preferably less than a thickness which allows the shrinkage-inhibiting layers (i.e., the second ceramic layers) 2 to suppress shrinkage. The first ceramic layers 1 need not necessarily have the same thickness.

As the first ceramic material, a ceramic material which partially (e.g., a glass component) penetrates into the second ceramic layers 2 during firing is used. Further, as the first ceramic material, LTCC (Low Temperature Co-fired Ceramic) which can be fired at a relatively low temperature, for example, about 1000° C. or less, is preferably used so that it can be co-fired with a conductor made of a low melting metal, such as silver or copper. Specifically, a glass ceramic including a mixture of alumina and borosilicate glass, a Ba—Al—Si—O ceramic which produces a glass component during firing, or other suitable glass ceramic can be used.

The second ceramic material defining the shrinkage-inhibiting layers (i.e., the second ceramic layers) 2 is fixed by a portion (glass component) of the first ceramic material which penetrates from the first ceramic layers 1, thereby solidifying the second ceramic layers and bonding the first ceramic layers 1 and the second ceramic layers 2.

As the second ceramic material defining the shrinkage-inhibiting layers (i.e., the second ceramic layers) 2, alumina, zirconia, silica, or other suitable ceramic material can be used. When the second ceramic layers 2 include the green second ceramic material having a higher sintering temperature than that of the first ceramic material, the second ceramic layers 2 provide the function of suppressing shrinkage in the planar direction of the first ceramic layers 1 in the firing step. Also, as described above, the second ceramic layers 2 are fixed and bonded to the first ceramic layers 1 due to the penetration of a portion of the first ceramic material. Therefore, the thickness of the second ceramic layers 2 is preferably in the range of about 1 μm to about 10 μm, for example, depending on the states, constraint force, and firing conditions of the first ceramic layers 1 and the second ceramic layers 2.

The second ceramic layers 2 may include a glass component functioning as a fixing member for the second ceramic layers 2 in a range in which the second ceramic layers 2 cause no shrinkage behavior during fixing. As the glass component, a glass having substantially the same composition as the glass component added to the first ceramic layers 1 and the glass component produced in the first ceramic layers 1 during firing is preferably used.

In this preferred embodiment, a Ba—Al—Si—O ceramic material is preferably used for the first ceramic layers 1, and alumina is preferably used as the ceramic material defining the second ceramic layers 2. In addition, the thickness of the first ceramic layers 1 is preferably adjusted to about 50 μm, for example, after firing, and the thickness of the second ceramic layers 2 is preferably adjusted to about 5 μm, for example, after firing.

In addition, any one of known various materials can be used for each of the conductors, such as the internal in-plane conductors 3, the external conductors 5, and the terminal electrodes 6 as long as a main component is a conductive component which can be co-fired with the first ceramic layers 1. Specifically, Cu, Ag, Ni, Pd, and oxides and alloys thereof can be used, for example. In the present preferred embodiment, a material including a Cu component as a main component (e.g., conductive paste containing a Cu powder as a conductive component) is preferably used to form a conductor portion.

Next, a method for manufacturing the multilayer ceramic electronic component A will be described.

Figure 3:
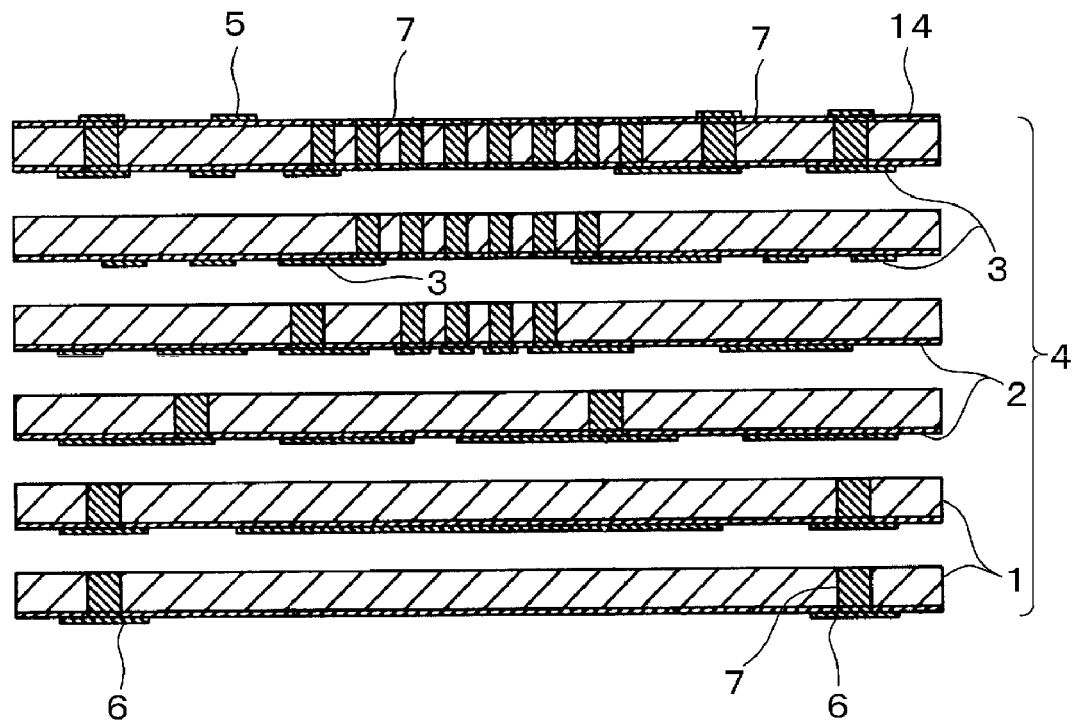
FIG. 3 shows a step of a method for manufacturing a multilayer ceramic electronic component according to a preferred embodiment of the present invention.

First, as shown in FIG. 3, a conductive paste including a Cu powder as a conductive component is printed at predetermined locations of a ceramic green sheet which is used as each of the first ceramic layers 1 and the second ceramic layers 2 to dispose the internal in-plane conductors 3, the external electrodes 5, the terminal electrodes 6, or the via hole conductors 7.

The resultant ceramic green sheets are stacked in the predetermined order along the predetermined direction and compressed to form a green sheet molded product (green multilayer ceramic body 4).

Figure 4:
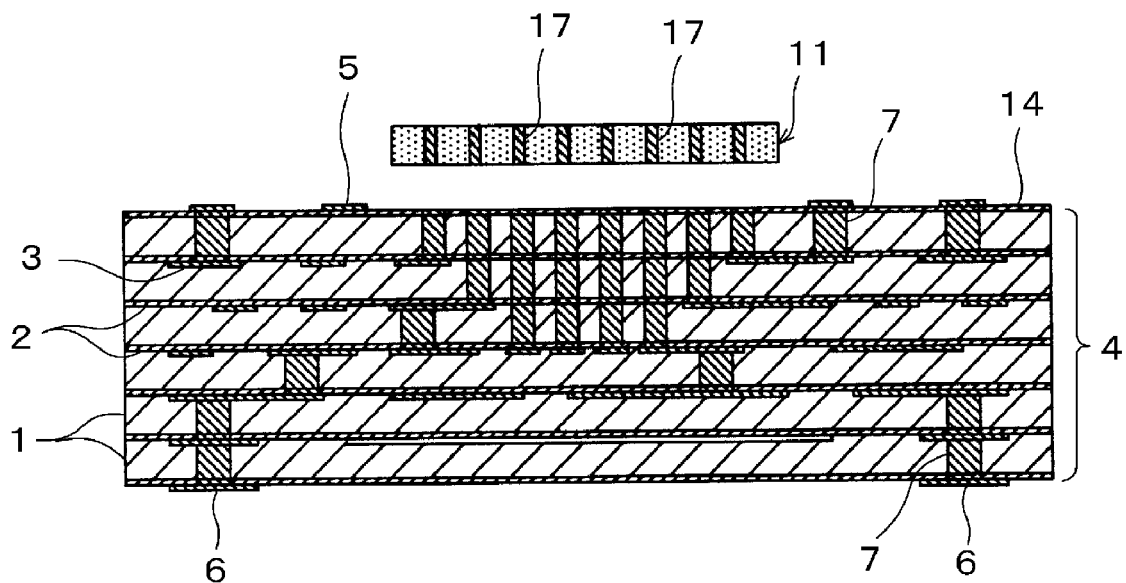
FIG. 4 shows another step of the method for manufacturing a multilayer ceramic electronic component according to a preferred embodiment of the present invention.
Figure 5:
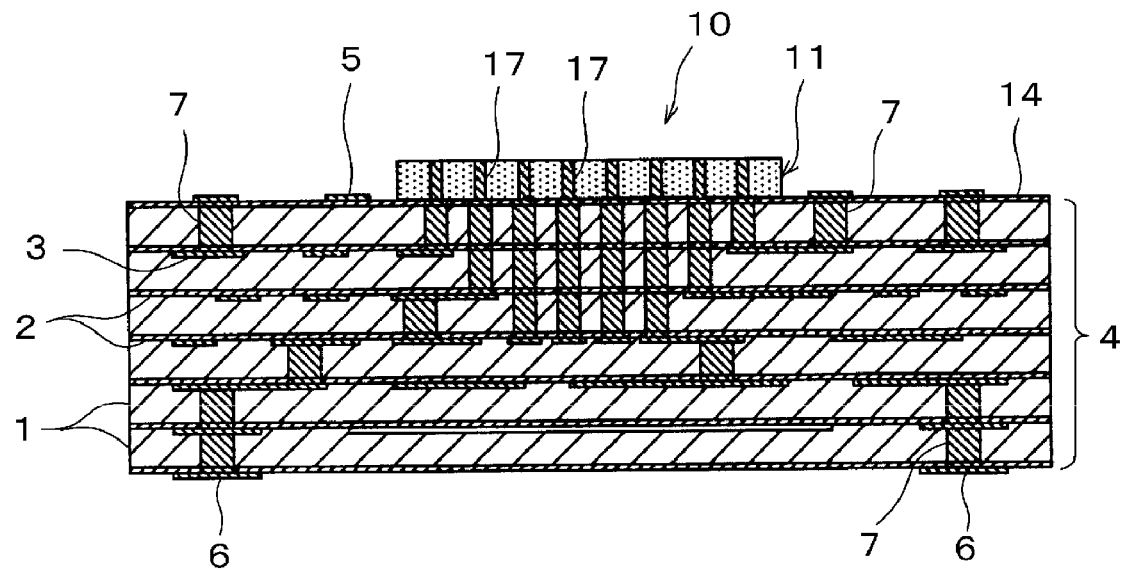
FIG. 5 shows still another step of the method for manufacturing a multilayer ceramic electronic component according to a preferred embodiment of the present invention.

Then, as shown in FIGS. 4 and 5, the pedestal portion 11 is disposed at a predetermined location of the green multilayer ceramic body 4 (green sheet molded product).

The pedestal portion 11 can be formed as follows. Via hole conductors including, for example, Ag or Cu as a main component are provided in a green sheet including as a main component a non-metallic inorganic powder (e.g., a ceramic powder of alumina, zirconia, or GaN) which is not sintered at the firing temperature of the first ceramic material. As shown in FIG. 5, the green sheet is disposed at a predetermined location of the green multilayer ceramic body 4 and fired together with the green multilayer ceramic body 4. The thickness of the pedestal portion 11 is preferably in the range of about 30 μm to about 150 μm, for example, after firing.

The pedestal portion 11 (before firing) can be manufactured by, for example, the method described below.

Figure 9A:
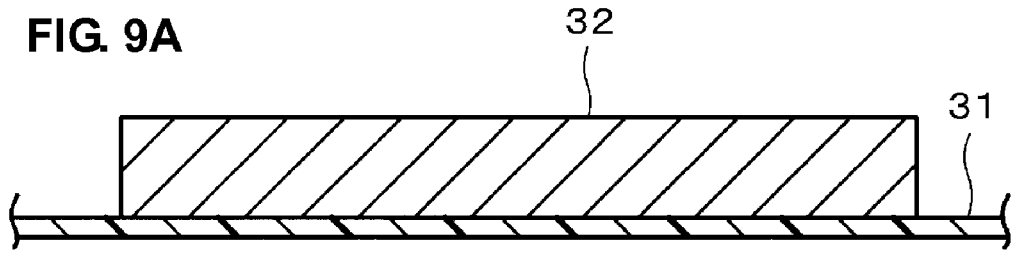
FIGS. 9A to 9E shows a method for forming a pedestal portion defining a multilayer ceramic electronic component according to a preferred embodiment of the present invention.
Figure 9B:
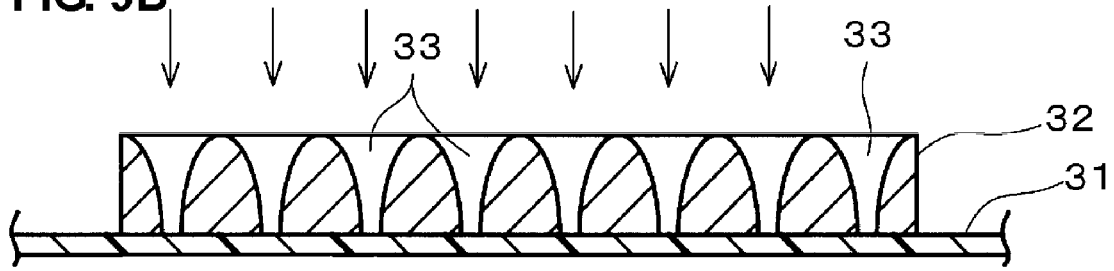

First, as shown in FIG. 9A, a green sheet for forming a pedestal portion, e.g., a green sheet 32 including as a main component a non-metallic inorganic powder (for example, a ceramic powder of alumina, zirconia, or GaN) which is not sintered at the firing temperature of the first ceramic material is formed on a carrier film 31. Then, as shown in FIG. 9B, through holes 33 for via hole conductors are formed at predetermined locations of the green sheet 32 by laser processing. In this preferred embodiment, a green sheet including alumina as a main component is preferably used as the green sheet for forming a pedestal portion.

Figure 9C:
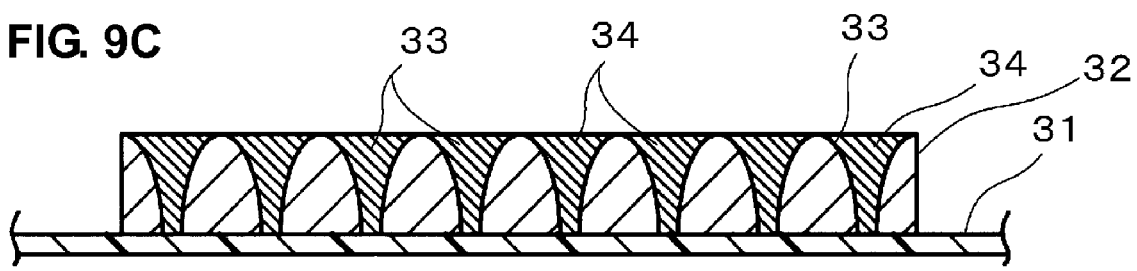

Then, as shown in FIG. 9C, a conductive paste 34 is filled in the through holes 33.

Figure 9D:
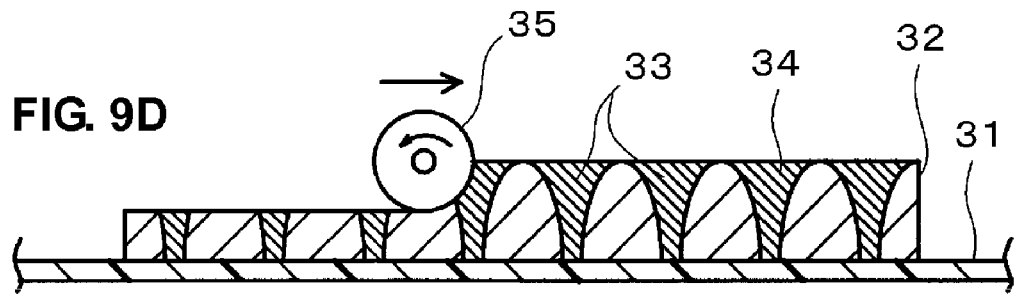

In the state shown in FIG. 9C, short circuiting may occur in the conductive paste 34 filled in the through holes 33. Therefore, as shown in FIG. 9D, the surface of the green sheet 32 is ground with an abrasive roll 35 to remove the conductive paste 34 covering the surface and an upper portion of the green sheet 32 and to planarize the upper surface. As a result, the pedestal portion (before firing) 11 having via hole conductors with a flat upper surface, no probability of short circuiting, and a narrow pitch as shown in FIG. 9E is formed.

Figure 9E:
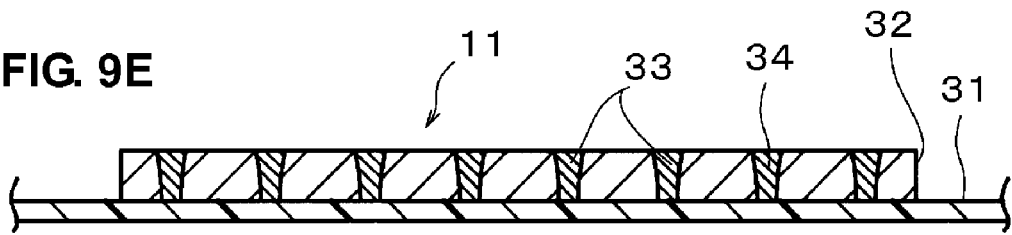
Figure 10:
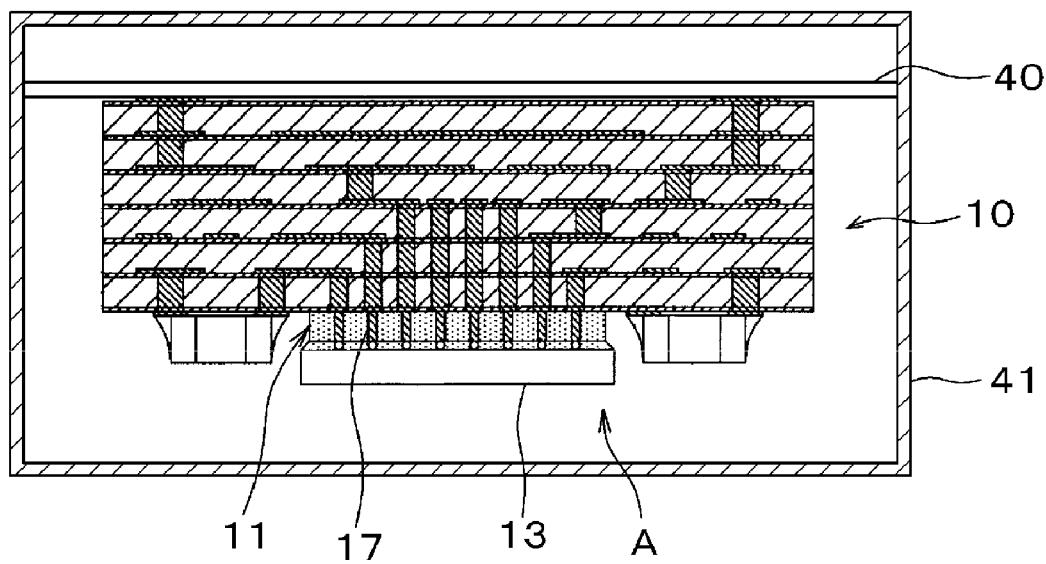
FIG. 10 shows a sample prepared for examining the impact resistance of a multilayer ceramic electronic component manufactured by the method for manufacturing a multilayer ceramic electronic component according to a preferred embodiment of the present invention.
Figure 11:
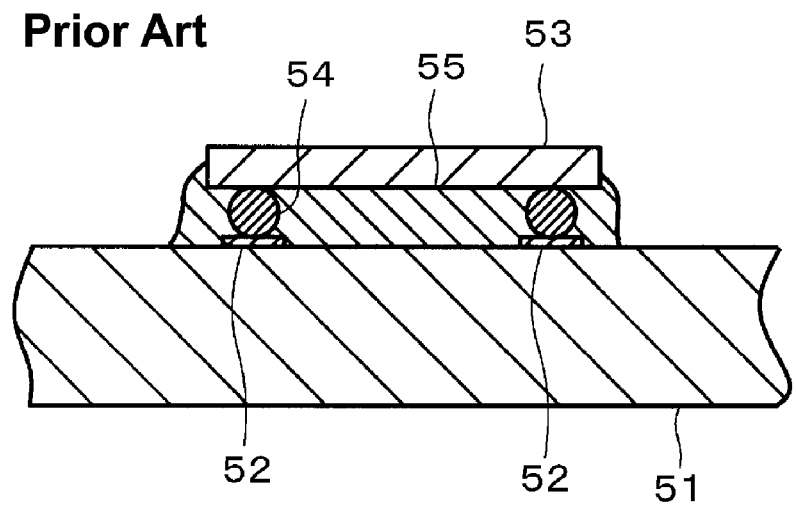
FIG. 11 is a drawing showing a conventional method for mounting a semiconductor device.
Figure 12:
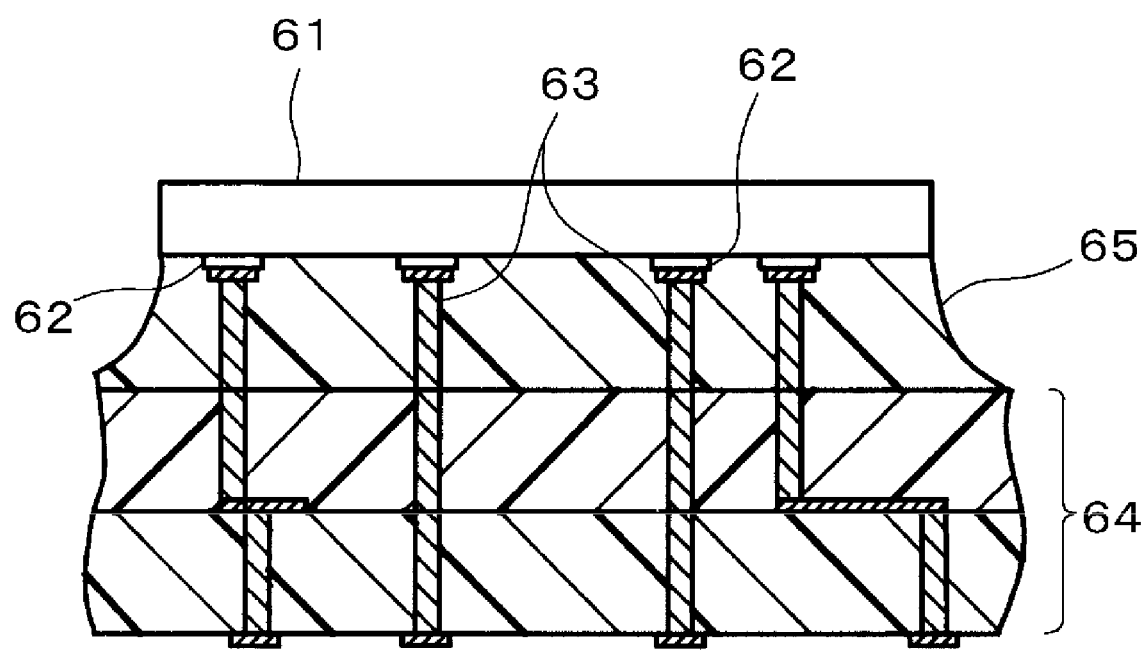
FIG. 12 is a drawing showing another conventional mounting structure of a semiconductor element.

Then, the pedestal portion 11 before firing shown in FIG. 9E is disposed on the first main surface 14 of the green multilayer ceramic body 4 so that the upper surface of the pedestal portion 11 is bonded to the first main surface 14 of the green multilayer ceramic body 4. The carrier film 31 (FIG. 9E) is removed to produce a state in which the pedestal portion 11 is disposed at the predetermined location of the green multilayer ceramic body 4 as shown in FIG. 5.

The same ceramic green sheet as that used for forming the second ceramic layers can be used as the green sheet for forming the pedestal portion and can be formed on the carrier film.

A ceramic green sheet made of the same ceramic material as that defining the second ceramic layers can be used as the green sheet for forming the pedestal portion.

Various ceramic green sheets having different compositions from that of the ceramic material defining the second ceramic layers can be used.

Then, the green multilayer ceramic body 4 is fired under conditions controlled to a predetermined temperature and atmosphere to prepare the multilayer ceramic substrate 10 having the pedestal portion 11 provided on the upper surface (first main surface) 14 of the multilayer ceramic body 4 (refer to FIG. 5). In this state, the pedestal portion 11 is present as a porous molded product in which ceramic particles aggregate.

At this time, the multilayer ceramic body 4 is fired at a temperature at which the first ceramic material is sintered, but the second ceramic material is not sintered. Therefore, when the first ceramic layers made of the first ceramic material tend to shrink, the second ceramic layers 2 function as the shrinkage-inhibiting layers to suppress shrinkage of the first ceramic layers. Consequently the multilayer ceramic substrate 10 having outstanding dimensional precision can be formed. In firing by the method of this preferred embodiment, shrinkage occurs in the thickness direction (shrinkage to a thickness of about 45% to about 65% of the thickness before firing, for example), while substantially no shrinkage occurs in the planar direction perpendicular to the thickness direction.

The firing atmosphere is appropriately controlled according to the type of the first ceramic material and the type of the conductive powder included in a conductive paste film.

Next, the resultant multilayer ceramic substrate 10 is surface-treated according to need and then a surface mounting type electronic component is mounted.

Any one of various components can be mounted as the surface mounting type electronic component depending on the circuit provided. Examples of such a components include active elements such as a transistor, IC, and LSI, for example, and passive elements such as a chip capacitor, a chip resistor, a chip thermistor, and a chip inductor, for example.

In this preferred embodiment of the present invention, particularly, mounting of a bare chip mounting type semiconductor element such as IC, LSI, or other suitable element is described as an example.

Figure 6:
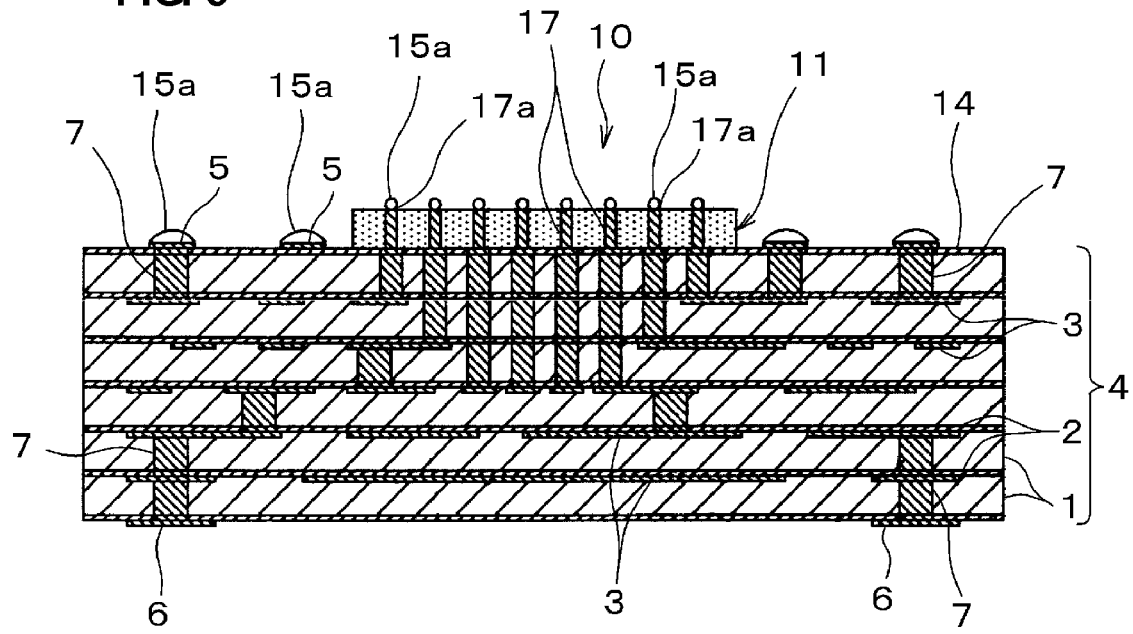
FIG. 6 shows a further step of the method for manufacturing a multilayer ceramic electronic component according to a preferred embodiment of the present invention.

First, as shown in FIG. 6, a solder paste 15a is applied to the upper end surfaces 17a of the pedestal via hole conductors 17. The application method is not particularly limited, and any of various known methods such as printing, dipping, and dispensing can be used.

Figure 7:
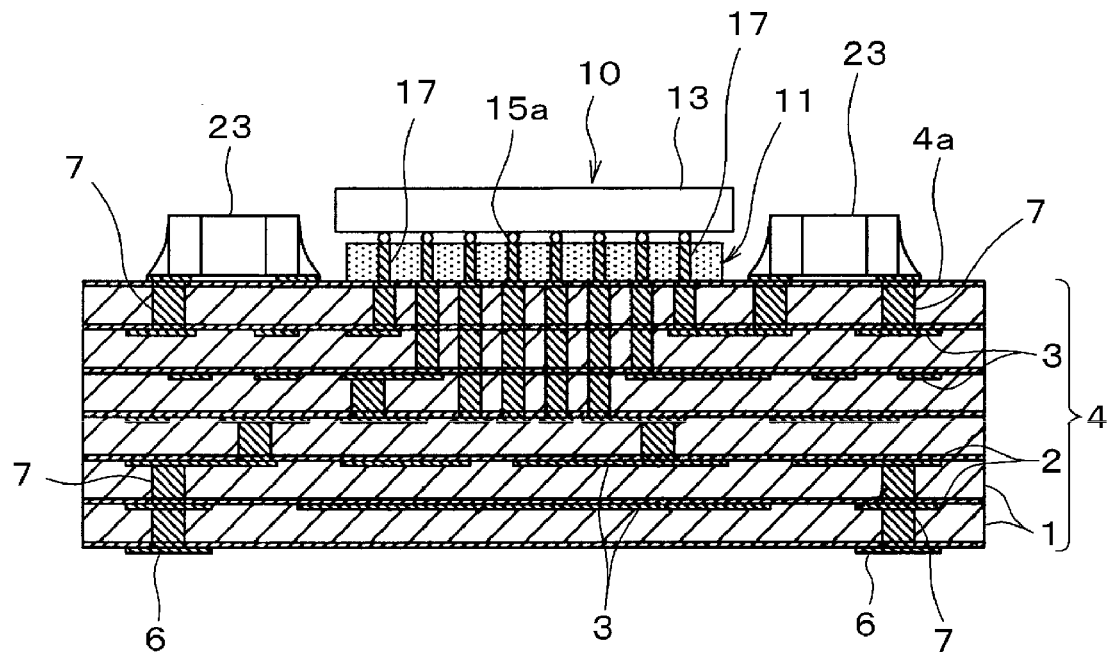
FIG. 7 shows a still further step of the method for manufacturing a multilayer ceramic electronic component according to a preferred embodiment of the present invention.

In this case, the solder paste 15a is also applied to the external conductors 5 which are disposed in a region of the first main surface 14 of the multilayer ceramic body 4, in which the pedestal 11 is not provided, for mounting another surface mounting type electronic component (multilayer ceramic capacitor) 23 (refer to FIG. 7).

Then, as shown in FIG. 7, the semiconductor element 13 is mounted on the solder paste 15a, and another surface mounting type electronic component (e.g., a multilayer ceramic capacitor) 23 is mounted on a region of the upper surface (first main surface) 14 of the multilayer ceramic body 4, in which the pedestal 11 is not disposed. The solder paste 15a is melted by a reflow furnace which is set to a predetermined temperature profile to bond the semiconductor element 13 to the upper end surfaces 17a of the pedestal via hole conductors 17 and to connect the other surface mounting type electronic component 23 to the external conductors 5 which are disposed in the periphery of the region of the first main surface 14 of the multilayer ceramic body 4, in which the pedestal 11 is disposed.

Then, a resin is injected between the semiconductor element 13 and the pedestal portion 11 to form the resin layer 16 between the semiconductor element 13 and the pedestal portion 11 and to impregnate the resin to the lower surface side of the porous ceramic molded product defining the pedestal portion 11. Since the resin selectively penetrates and enters into the porous pedestal portion 11 and between the semiconductor element 13 and the pedestal portion 11 due to a capillary effect, the resin is not likely to flow into other regions.

In addition, the resin is heat-cured to fix the pedestal portion 11 to the first main surface 14 of the multilayer ceramic body 4 using the resin. In the present preferred embodiment, a silica filler and an epoxy resin are preferably used as the resin, for example.

As a result, the multilayer ceramic electronic component A is formed, in which the semiconductor element 13 is mounted on the pedestal portion 11 including the aggregate of the non-metallic inorganic powder 21 (FIG. 2B) which is fixed to a region of the first main surface 14 of the multilayer ceramic body 4 with the resin 22 (FIG. 2B).

The pedestal portion 11 includes the aggregate of ceramic particles, the silica filler, and the resin which bonds these inorganic components together. The resin layer 16 including the silica filler dispersed therein is disposed between the pedestal portion 11 and the semiconductor element 13.

In addition, in the multilayer ceramic electronic component A, the semiconductor element 13 is securely mechanically connected to the multilayer ceramic body 4 (multilayer ceramic substrate 10) with the resin layer 16 through the pedestal portion 11 and is securely electrically connected to the multilayer ceramic body 4 (multilayer ceramic substrate 10) through the pedestal via hole conductors 17 and the solder 15. Thus, a multilayer ceramic electronic component A is provided which has outstanding impact resistance, a reduced size, high dimensional precision, and high reliability.

The multilayer ceramic electronic component A according to the preferred embodiment as described above was reflow-mounted on a printed wiring board 40 having a thickness of about 1.0 mm using a solder paste. Then, the multilayer ceramic electronic component A mounted on the printed wiring board 40 was placed in a resin casing 41 in the form of a substantially rectangular parallelepiped so that the multilayer ceramic electronic component A was located on the lower side to prepare a sample having a structure in which the multilayer ceramic electronic component A was disposed in the resin casing 41.

In addition, the sample was adjusted such that the total weight of the multilayer ceramic electronic component A, the printed wiring board 40, and the resin casing 41 was about 100 g.

Furthermore, the diameter of the pedestal via hole conductors 17 defining the multilayer ceramic substrate 10 was about 100 μm.

Then, the sample was held at a predetermined height and dropped ten times on a concrete block stationarily placed so that the upper surface was horizontal such that the lower surface of the resin casing 41 collided in a horizontal state. Then, the breakage at the connection portion between the semiconductor element 13 and the multilayer ceramic substrate 10 was examined.

The drop height was stepwisely increased by about 0.10 m from about 0.50 m, and the drop height at which the breakage occurred was measured as a breakage occurrence height to evaluate impact resistance. The results are shown in Table 1.

Figure 8:
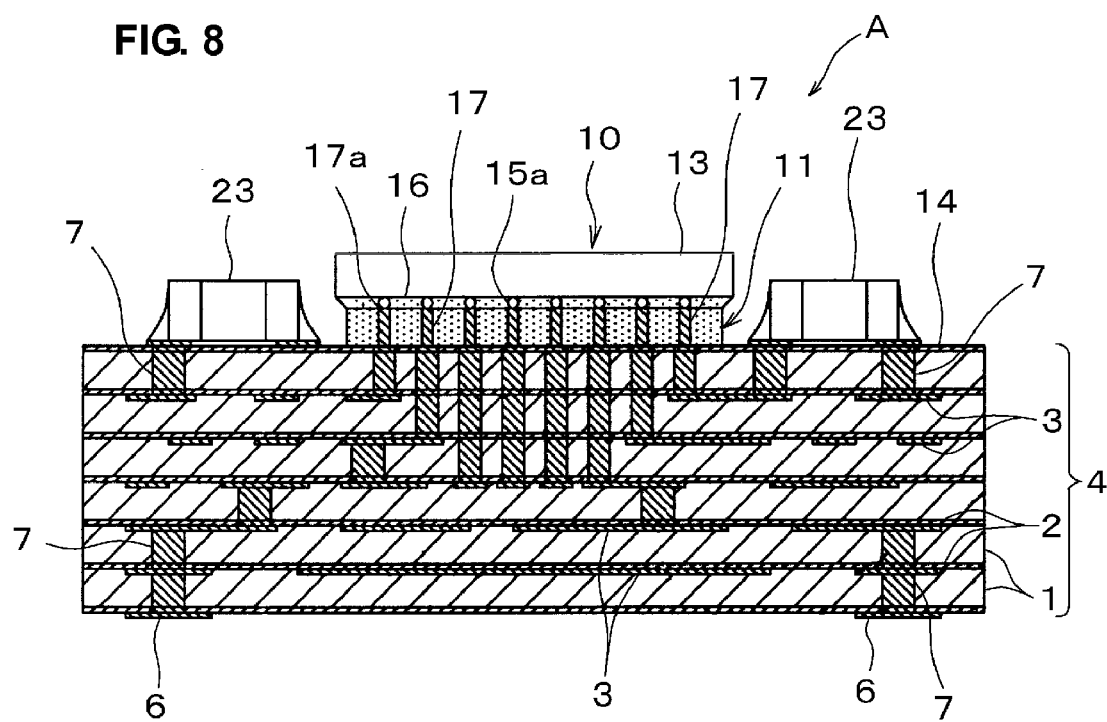
FIG. 8 shows a multilayer ceramic electronic component manufactured by the method for manufacturing a multilayer ceramic electronic component according to a preferred embodiment of the present invention.

For a comparison, the same multilayer ceramic electronic component as shown in FIG. 8 except that the pedestal portion 11 was not provided was mounted on a printed wiring board and disposed in a resin casing to prepare a sample (comparative example). The same test as described above was conducted to evaluate impact resistance. The results are also shown in Table 1.

The multilayer ceramic electronic component used in the comparative example was prepared under substantially the same conditions as for the multilayer ceramic electronic component of Example 1 except that the pedestal portion and the pedestal via hole conductors were not provided.

TABLE 1

| Sample No. | Breakage occurrence height (m) | Height of pedestal via hole conductor (μm) | Resin injection property | Impact resistance |
|---|---|---|---|---|
| 1 (Preferred Embodiment) | 1.40 | 150 | Insufficient | B |
| 2 (Preferred Embodiment) | 1.50 | 100 | Good | A |
| 3 (Preferred Embodiment) | 1.50 | 50 | Good | A |
| 4 (Preferred Embodiment) | 1.50 | 30 | Good | A |
| 5 (Preferred Embodiment) | 1.50 | 15 | Good | B |
| 6 (Comparative Example) | 0.50 | — | No injection of resin | C |

In Table 1, particularly good impact resistance is shown by A, good impact resistance is shown by B, and poor impact resistance is shown by C.

The resin injection property represents the degree of penetration of the resin into the pedestal portion. Sufficient penetration is evaluated as "Good", and insufficient penetration is evaluated as "Insufficient".

Table 1 indicates that multilayer ceramic electronic components according to a preferred embodiment of the present invention have greatly improved impact resistance, as compared to the comparative example.

However, when the height of the pedestal via hole conductors is about 150 μm (i.e., when the thickness of the pedestal portion is large), the resin does not sufficiently penetrate into the pedestal portion, and thus, the impact resistance is not evaluated as "particularly good". However, the impact resistance is a practicable level.

On the other hand, when the height of the pedestal via hole conductors is in the range of about 15 μm to about 100 μm, the results of sufficient resin injection and particularly good or good impact resistance are obtained.

Table 1 also indicates that although the thickness of the pedestal portion which permits sufficient penetration of the resin into the pedestal portion depends on the injection amount of the resin, the injection amount of the resin tends to be insufficient when the thickness of the pedestal portion exceeds about 150 μm and the space between the pedestal portion and the semiconductor element is about 80 μm. Therefore, the thickness of the pedestal portion is preferably limited to about 150 μm or less, for example.

In the preferred embodiment, the method of electrically bonding the pedestal via hole conductors 17 and the semiconductor element 13 using a solder paste is described as an example. However, another configuration may be used, in which instead of the solder paste, solder balls are previously disposed on the semiconductor element 13 and melted to bond the pedestal via hole conductors 17 and the semiconductor element 13.

With respect to other points, the present invention is not limited to the preferred embodiments described above. Various applications and modifications can be made regarding the types of the non-metallic inorganic powder and the resin which define the pedestal portion, the arrangement, dimensions, and constituent material of the via hole conductors provided in the pedestal portion, the constituent materials and compositions of the ceramic base material layer and the shrinkage-inhibiting layer, the type of the surface mounting type electronic component to be mounted on the pedestal portion, and others as factors within the scope of the present invention.

According to preferred embodiments of the present invention, a multilayer ceramic electronic component having outstanding impact resistance, a reduced size, high dimensional precision, and high reliability is provided.

Therefore, preferred embodiments of the present invention can be used in fields such as a multilayer ceramic substrate, a multilayer ceramic electronic component and a multilayer module in which a semiconductor element and other surface mounting-type electronic components are mounted on a multilayer ceramic substrate.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A multilayer ceramic electronic component comprising:
a multilayer ceramic body including a ceramic base material layer and a shrinkage-inhibiting layer arranged to suppress shrinkage stacked in a planar direction of the ceramic base material layer and a conductor pattern;
a pedestal portion arranged on a region of a first main surface of the multilayer ceramic body and including a non-metallic inorganic powder and a resin such that the pedestal portion is fixed to the first main surface with at least the resin;

a via hole conductor arranged in the pedestal portion so that one end surface of the via hole conductor is exposed in a surface of the pedestal portion; and a surface mounting-type electronic component connected, through a conductive binder, to the one end surface of the via hole conductor exposed in the surface of the pedestal portion.

2. The multilayer ceramic electronic component according to claim 1, wherein a resin is provided between the surface mounting-type electronic component and the pedestal portion, the resin having substantially the same composition as the resin of the pedestal portion.

3. The multilayer ceramic electronic component according to claim 1, wherein the surface mounting-type electronic component which is connected, through the conductive binder, to the one of the end surfaces of the via hole conductor exposed in the surface of the pedestal portion, is a semiconductor element.

4. The multilayer ceramic electronic component according to claim 1, wherein a surface mounting-type electronic component is also mounted on a region of the first main surface of the multilayer ceramic body, in which the pedestal portion is not provided.

5. The multilayer ceramic electronic component according to claim 1, wherein the via hole conductor is arranged to pass through the pedestal portion, and another end surface not exposed in the surface of the pedestal portion is connected to the conductor pattern of the multilayer ceramic body.

6. The multilayer ceramic electronic component according to claim 1, wherein the shrinkage-inhibiting layer is provided at the first main surface of the multilayer ceramic body.

7. The multilayer ceramic electronic component according to claim 1, wherein an area of the pedestal portion is less than that of the surface mounting-type electronic component mounted on the pedestal portion.

8. The multilayer ceramic electronic component according to claim 1, wherein a thickness of the pedestal portion is about 30 μm to about 150 μm.

9. The multilayer ceramic electronic component according to claim 1, wherein the ceramic base material layer includes a low-temperature sintered ceramic as a main component, and the shrinkage-inhibiting layer includes a sintering-resistant ceramic as a main component which is not substantially sintered at the sintering temperature of the low-temperature sintered ceramic.

10. The multilayer ceramic electronic component according to claim 1, wherein the non-metallic inorganic powder of the pedestal portion is a ceramic powder which is not substantially sintered at the sintering temperature of the ceramic of the ceramic base material layer.

11. A multilayer ceramic substrate comprising:
a multilayer ceramic body including a ceramic base material layer and a shrinkage-inhibiting layer arranged to suppress shrinkage stacked in a planar direction of the ceramic base material layer and a conductor pattern;

a pedestal portion arranged on a region of a first main surface of the multilayer ceramic body and including a non-metallic inorganic powder and a resin such that the pedestal portion is fixed to the first main surface with at least the resin;

a via hole conductor arranged in the pedestal portion so that one end surface of the via hole conductor is exposed in a surface of the pedestal portion; and a conductive binder disposed on the one end surface of the via hole conductor.

* * * * *